Dec. 6, 1960 J. W. IRVINE, JR 2,963,630

SURFACE TREATMENT OF SEMICONDUCTIVE DEVICES

Filed Oct. 20, 1959

INVENTOR.
JOHN W. IRVINE, JR.

BY

Max D. Farmer

ATTORNEYS

United States Patent Office 2,963,630

Patented Dec. 6, 1960

2,963,630

SURFACE TREATMENT OF SEMICONDUCTIVE DEVICES

John W. Irvine, Jr., Belmont, Mass., assignor, by mesne assignments, to the United States of America as represented by the Secretary of the Navy Filed Oct. 20, 1959, Ser. No. 847,670

15 Claims. (Cl. 317—234)

This invention relates to semiconductive devices and materials and more particularly to the surface treatment of these devices.

Semiconductive devices of the p-n junction diode or transistor type function because of an asymmetrical electrical barrier which varies with an applied potential across the external contacts. This barrier, because of its electrical asymmetry, provides a rectifying action in a circuit and, in the case of a transistor, one junction affecting the second gives a variable rectifying action which then acts as a control element and is capable of amplification. It has been generally found that the external surfaces of these semiconductive devices require protection from moisture and other contaminants in order to prevent deleterious effects and to obtain and maintain the desirable electrical characteristics of these devices. The surfaces of semiconductive materials contain adsorbed moisture and contaminants usually after exposure to the atmosphere, thereby lowering the surface resistance of the semiconductive material and impairing the efficiency and operation of the device. Where the semiconductive surface resistance is lowered, the asymmetrical electrical barrier is shunted by this surface resistance and the electrical asymmetry of the device is substantially reduced impairing both the efficiency and operation of the device as a rectifier or amplifier. In accordance with this invention, this deficiency is overcome by coating the exposed surface of the semiconductor with a material exhibiting desirable characteristics which would not adversely affect the functioning of the semiconductor, such as being chemically inert, exhibiting good temperature stability, possessing high volume and surface resistivities and having excellent dielectric properties. In addition to the above, this invention provides for the removal of the adsorbed moisture of the semiconductive material, prior to packaging.

An object of this invention is to produce a semiconductive device whose exposed surfaces are protected from moisture by a film coating with which the most desirable electrical properties or characteristics of the device may be obtained and maintained.

Another object of this invention is to remove, prior to packaging, the adsorbed moisture from the exposed surfaces of a semiconductive material and chemically bond a protective coating to these exposed surfaces which will resist wetting and prevent deterioration of the semiconductive material due to moisture.

Another object is to provide a simple, inexpensive, and practical method of application of a protective coating to semiconductive materials.

Other objects and advantages will be apparent from the following description of an example of the invention and the novel features thereof will be particularly pointed out hereinafter in connection with the appended claims.

Figure 1:
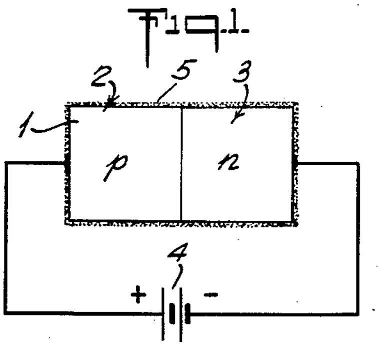
Figure 2:
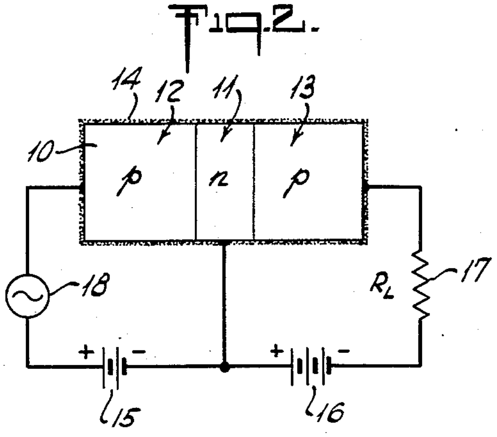

In the accompanying drawings:

Fig. 1 is a diagrammatic illustration of a junction diode after surface treatment in accordance with this invention, and Fig. 2 illustrates a junction transistor after this surface treatment.

Both silicon and germanium are used in commercially available junction rectifiers or diodes, although for high-power applications silicon is superior. Junction transistors have several advantages over the point contact type; they are more tractable theoretically, capable of handling greater powers and have lower noise figures. Junction transistors are therefore more useful in a wider range of applications and allow for greater circuit control. Although silicon is one of the commonest elements on earth, namely, sand, its preparation in suitable form for semiconduction is a complicated and expensive process. Germanium rectifiers and transistors were the first to appear due in part to the fact that germanium is more amenable in manufacturing processes.

It is well known that semiconductive materials used in the fabrication of junction diodes and transistors contain adsorbed moisture within their exposed surfaces and moisture on their surfaces. The shunting effect of this moisture across the barrier will reduce the efficiency and capabilities of the diode or transistor so that protective coatings must be applied to the device in order to reduce this deleterious effect. Removal of the surface moisture and contaminants is of value but without removing the adsorbed moisture somewhat below the surface, the maximum capabilities of the device cannot be realized. The removal of this adsorbed moisture can most advantageously be accomplished during the application of a protective coating over the exposed semiconductor surfaces. The most desirable coating is one that exhibits excellent protective characteristics without impairing the electrical properties of the device and at the same time removes the adsorbed moisture.

The surface treatment and coatings of this invention are illustrated, for the sake of clarity, for application to grown germanium semiconductors, though they may be applied to other varieties of semiconductive materials. The particular surface coatings which applicant employs are the unhydrolyzed titanium esters, i.e., tetra isopropyl titanate (TPT), tetra-n-butyl titanate (TBT), tetra 2-ethylhexyl titanate (TOT), tetra stearyl titanate (TST), which are currently commercially available.

After the germanium junction diode or transistor, for example, has been fabricated and electrical connections made to the device, the coating by any one of the above identified esters may be applied by either dipping, or suspension in the vapor, both of which methods are well known in the art. The film coating is now stabilized by any number of established methods, as for instance, by the application of heat or the use of a catalyst. The result of this application is to provide a firmly and chemically bonded layer of titanium dioxide film upon the entire exposed surfaces of the germanium diode or transistors.

If we consider now that a particular titanium ester, as for instance tetra isopropyl titanate, was employed in the above described example, then the theoretical chemical reactions of the system may be described. Since the above-identified ester, as are the others previously mentioned, is an unhydrolyzed compound, it will readily react with water. It is assumed that there exists a tightly bound adsorbed layer of water on the germanium surface and further that the oxygen atom of this water molecule is closest to the surface of the germanium. When the unhydrolyzed titanium ester comes in contact with this adsorbed water during the coating application, the hydrogen atoms of the water are taken up in a replacement reaction and combined with the isopropyl group to produce and to be given off in the form of isopropyl alcohol and at the same time the titanium dioxide units with the tightly bound oxygen atoms. This film coating once polymerized or stabilized has an extremely high resistance relative to the junction barrier resistance and thus prevents shunting of this junction barrier by lower resistance surface films. In addition, the chemical inertness and water repellant properties of this film coating provide protection against further contamination by materials of lower surface resistivities. Examination and evaluation of this protective coating reveals also that the coating applied in accordance with this invention is firmly bonded to the germanium surface, possesses excellent temperature stability and dielectric properties.

Figs. 1 and 2 illustrate typical simple circuits employing junction diodes and transistors after surface treatment of these devices in accordance with this invention. The junction rectifier or diode illustrated in Fig. 1 comprises a semiconductor body 1 of grown germanium having a junction between a p-type region 2, an n-type region and electrically connected for rectification. The battery 4 is shown in order to illustrate the proper polarity of the applied voltage. The body 1 is completely enclosed by a protective coating 5 which has been applied in accordance with the teachings of this invention to a junction rectifier.

The transistor shown in Fig. 2 is of a simple type though the teachings of this invention apply equally well to a more complex form. The transistor comprises a semiconductive body 10 including an intermediate zone 11 of material of one conductivity type flanked by zones 12 and 13 of material of the other conductivity type and a protective dielectric adherent coating 14 which is carried on body 1 and completely envelopes it. This coating has been applied to the semiconductive body by the methods of this invention and serves to protect the semiconductor surfaces from moisture and contaminants which, if present, would impair the efficiency and operation of this grown junction germanium device. The external circuitry including the batteries 15 and 16, load resistor 17 and a signal input source 18 illustrate the application of this junction transistor to an amplifying condition.

It will be understood that various other changes in the steps, details and materials which have been herein disclosed in order to explain the nature of this invention may be made by those skilled in the art within the principle and scope of the invention as expressed in the appended claims.

I claim:

1. A semiconductor device having a junction between p- and n-type materials, and a protective dielectric coating of an unhydrolyzed titanium ester on the surface of and enclosing said device for combination with the adsorbed moisture on such surface and protection against contamination by external moisture reaching said surface.

2. The device according to claim 1, wherein said coating material is polymerized.

3. The device according to claim 1, wherein said p- and n-type materials are of germanium.

4. The device according to claim 1, wherein said p- and n-type materials are of grown germanium.

5. The device according to claim 1, wherein said p- and n-type materials are of germanium and said coating material is polymerized.

6. A solid conductive device comprising a body of semiconductive material including an intermediate zone of material of one conductivity type flanked by zones of material of the other conductivity type, and a protective dielectric adherent coating of an unhydrolyzed titanium ester on the exposed surface of said body and enclosing said body for combination with any adsorbed moisture on such exposed surface and protection against contamination by external moisture reaching said surface.

7. The device according to claim 6, wherein said semiconductive material is of germanium.

8. The device according to claim 5, wherein said semiconductive material is grown germanium.

9. The device according to claim 5, wherein said coating is polymerized.

10. The device according to claim 6, wherein said semiconductive material is of germanium and said coating is polymerized.

11. A solid conductive device comprising a semiconductive body having successive zones of material of progressively opposite conductivity type, each separated from an adjoining zone by an electrical barrier, and a coating, enclosing and protecting such body, of an unhydrolyzed titanium ester adherent to the entire exposed surface of said body for combination with any adsorbed water on said exposed surface and protection against contamination by external water reaching said surface.

12. The method of treating a semiconductive body having successive zones of material of progressively opposite conductivity type, each separated from the other by an electrical barrier, to remove adherent and adsorbed water from the surface layer of said body which comprises applying to the surface of said body an adherent film coating of an unhydrolyzed titanium ester, for combination with such adsorbed and adherent water and the formation of a protective film that prevents contamination of such body surface from external water, and heating said coated body to stabilize said film coating.

13. The method according to claim 12, wherein said body is of germanium.

14. The method according to claim 12, wherein said body is of grown germanium.

15. The device according to claim 11, wherein said coating ester is tetra isopropyl titanate.

References Cited in the file of this patent

UNITED STATES PATENTS

| | | |
|---|---|---|
| 2,748,325 | Jenny | May 29, 1956 |
| 2,754,456 | Madelung | July 10, 1956 |
| 2,798,189 | Alexander | July 2, 1957 |
| 2,912,354 | Jung | Nov. 10, 1959 |
| 2,913,358 | Harrington et al. | Nov. 17, 1959 |